(12) United States Patent
Rochus et al.

(10) Patent No.: US 10,985,200 B2
(45) Date of Patent: Apr. 20, 2021

(54) METHOD FOR PRODUCING AN IMAGE SENSOR, AND AN IMAGE SENSOR

(71) Applicant: IMEC VZW, Leuven (BE)

(72) Inventors: Veronique Rochus, Leuven (BE); Xavier Rottenberg, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/234,472

(22) Filed: Dec. 27, 2018

(65) Prior Publication Data

US 2019/0206920 A1    Jul. 4, 2019

(30) Foreign Application Priority Data

Dec. 28, 2017   (EP) .................................... 17210777

(51) Int. Cl.
*H01L 31/0232*   (2014.01)
*H01L 27/146*    (2006.01)

(52) U.S. Cl.
CPC .. *H01L 27/14636* (2013.01); *H01L 27/14605* (2013.01); *H01L 27/14621* (2013.01); *H01L 27/14627* (2013.01); *H01L 27/14645* (2013.01); *H01L 27/14685* (2013.01); *H01L 27/14687* (2013.01); *H01L 27/14689* (2013.01)

(58) Field of Classification Search
CPC ......... H01L 27/14636; H01L 27/14605; H01L 27/14621; H01L 27/14627
USPC ...................................................... 257/432
See application file for complete search history.

(56) References Cited

U.S. PATENT DOCUMENTS

| 6,376,872 | B1 | 4/2002 | Pai |
| 7,442,637 | B2 | 10/2008 | Su et al. |
| 7,683,451 | B2 | 3/2010 | Shin |
| 7,926,006 | B2 | 4/2011 | Bailey et al. |

(Continued)

FOREIGN PATENT DOCUMENTS

| EP | 2924737 A1 | 9/2015 |
| WO | WO-2014101105 A1 | 7/2014 |

OTHER PUBLICATIONS

Nakhkoob, Behrooz et al., "High speed photodiodes in standard nanometer scale CMOS technology: a comparative study," Department of Electrical and Computer System Engineering.

(Continued)

*Primary Examiner* — Tan N Tran
(74) *Attorney, Agent, or Firm* — Moser Taboada

(57) ABSTRACT

A method for producing an image sensor comprises: depositing a first back-end-of-line, BEOL, layer above a substrate comprising an array of light-detecting elements, said BEOL layer comprising metal wirings being arranged to form connections to components on the substrate and together with depositing the first BEOL layer, improving planarization of the first BEOL layer by depositing a planarizing metal dummy pattern in the first BEOL layer, wherein a part of the planarizing metal dummy pattern is arranged above a light-detecting element, wherein the planarizing metal dummy patterns is formed from the same material as the metal wirings and is deposited to planarize density of the metal deposited in the first BEOL layer across a surface of the layer and wherein a shape and/or position of the metal dummy pattern above the array of light-detecting elements is designed to provide a desired effect on incident light.

10 Claims, 4 Drawing Sheets

(56) References Cited

U.S. PATENT DOCUMENTS

| | | | |
|---|---|---|---|
| 9,214,488 B2* | 12/2015 | Inoue | H01L 27/1464 |
| 2006/0199295 A1* | 9/2006 | Hong | H01L 27/14687 |
| | | | 438/48 |
| 2009/0309010 A1* | 12/2009 | Lee | H01L 27/14629 |
| | | | 250/216 |
| 2010/0177226 A1 | 7/2010 | Itonaga et al. | |
| 2015/0097998 A1 | 4/2015 | Kato et al. | |
| 2016/0093653 A1 | 3/2016 | Tatani et al. | |
| 2017/0176671 A1* | 6/2017 | Kao | G02B 6/12004 |

OTHER PUBLICATIONS

Extended European Search Report dated Jun. 15, 2018 for Application No. 17210777.3.

* cited by examiner

METHOD FOR PRODUCING AN IMAGE SENSOR, AND AN IMAGE SENSOR

CROSS-REFERENCE TO RELATED APPLICATIONS

This application claims priority to EPC Application No. 17210777.3, filed on 28 Dec. 2017, which is incorporated herein by reference in its entirety.

TECHNICAL FIELD

The present inventive concept relates to a method for producing an image sensor and to an image sensor, which may be produced by such a method.

BACKGROUND

An image sensor comprises light-detecting elements, such as photo-diodes, which receive light incident on the image sensor for detecting light intensities which together may form an image. Light incident on the image sensor should reach the light-detecting element, which implies that any layers in the image sensor formed above the light-detecting elements should not interfere with light reaching the light-detecting elements.

A process for manufacturing image sensors is quite complex and, hence, expensive. In particular, any circuitry which may need to be arranged above the light-detecting elements, such as circuitry associated with reading out of light intensities and processing detected light intensities, should not interfere with light reaching the light-detecting elements.

This implies that metal layers which are present in back-end-of-line (BEOL) layers of the image sensor should be designed so as to not be arranged above the light-detecting elements. However, this may imply that a non-uniform distribution of material deposition is formed by the metal BEOL layers. Thus, an irregular topography may be formed, which may need to be smoothed, such as by chemical-mechanical planarization (CMP), between deposition of each BEOL layer. Hence, the number of steps needed for manufacturing the image sensor are extensive, which also implies that manufacturing of image sensors is expensive.

SUMMARY

An objective of the present inventive concept is to provide an improved method for producing an image sensor, which may reduce number of steps needed for producing the image sensor. It is a further objective of the present invention to utilize a method for producing an image sensor to improve functionality of the image sensor.

This and other objectives of the invention are at least partly met by the invention as defined in the independent claims. Preferred embodiments are set out in the dependent claims.

According to a first aspect, there is provided a method for producing an image sensor, said method comprising: depositing a first back-end-of-line (BEOL) layer above a substrate comprising an array of light-detecting elements, said BEOL layer comprising metal wirings being arranged to form connections to components on the substrate and together with depositing the first BEOL layer, improving planarization of the first BEOL layer by depositing a planarizing metal dummy pattern in the first BEOL layer, wherein a part of the planarizing metal dummy pattern is arranged above a light-detecting element, wherein the planarizing metal dummy pattern is formed from the same material as the metal wirings and is deposited to planarize density of the metal deposited in the first BEOL layer across a surface of the layer and wherein a shape and/or position of parts of the metal dummy pattern above the array of light-detecting elements is designed to provide a desired effect on incident light.

Thanks to the method, a BEOL layer is used for providing an optical element above light-detecting elements. The BEOL layer may therefore comprise an arrangement of a metal pattern above the array of light-detecting elements such that when the desired connections are formed by the BEOL layer (on sides of the array of light-detecting elements), a metal pattern which may form a passive optical element is also formed in that BEOL layer.

This implies that a material distribution of the BEOL layer need not be very non-uniform as it is accepted that parts of the metal pattern are formed above the light-detecting elements. Hence, a CMP step may not be needed after forming of the BEOL layer, which may simplify a process of producing the image sensor.

In many semiconductor fabrication plants, a design of an integrated circuit is adapted for facilitating production of the integrated circuit. In this regard, dummy patterns may be introduced in layers of the integrated circuit for simplifying forming of the layer and also enabling avoiding excessive planarization steps. Such adaptations of design are especially used in plants specializing in cheap fabrication of integrated circuits. Due to importance of avoiding any interference with light reaching light-detecting elements, fabrication of image sensors may typically not make use of production in cheap fabrication plants. By means of the method enabling the BEOL layer comprising wirings for connecting to components on the substrate (at sides of the array of the light-detecting elements) to be complemented with additional metal pattern above the light-detecting elements, the method may open up possibility of producing the image sensor at cheap fabrication plants.

The planarizing metal dummy pattern in the BEOL layer forms an additional metal pattern to the pattern of the BEOL layer connecting to components on the substrate. The additional metal pattern may be considered a "dummy pattern" in a sense that the additional metal pattern does not contribute to logic implementation of the image sensor and is not connected to any lines for receiving/outputting electrical signals. However, the additional metal pattern is not only provided in order to planarize the BEOL layer so as to provide a more uniform distribution of metal in the BEOL layer. On the contrary, the additional metal pattern provides an optical function which may improve or contribute to desired detection of light by the array of light-detecting elements. Thus, the "dummy pattern" should not be construed as to lack any function, as it in particular is configured and designed for providing a desired effect on incident light.

The BEOL layer may comprise a combination of a metal layer, which may provide metal wirings forming electrical connections to components below, and a dielectric layer, which may provide isolation between the metal wirings. The BEOL layer may thus comprise metal material portions separated by dielectric material portions.

The planarizing metal dummy pattern may include a plurality of metal parts, which may be separated by dielectric material in the BEOL layer. One or more of the plurality of metal parts may be arranged above a light-detecting element. Metal parts may be arranged above one light-detecting element or may extend to be arranged above one or more light-detecting elements.

A configuration of a plurality of metal parts separated by dielectric material in the BEOL layer may provide a combined optical effect of the metal dummy pattern on incident light.

The metal dummy pattern may be designed so as to form a passive optical element operative on incident light. For instance, the metal dummy pattern may be patterned so as to form a lens. In one embodiment, the metal dummy pattern may be patterned in a single BEOL layer so as to form a Fresnel-type lens. In particular, a lens arranged on top and close to a light-detecting element may direct light so as to allow the light-detecting elements to receive a greater light intensity. This implies that the light-detecting elements may collect more light and that pixel performance may be increased so as to improve functionality of the array of light-detecting elements.

However, it should be realized that the metal dummy pattern may be designed so as to form other types of passive optical elements, such as forming a filter, such as color filter, an angular filter or a polarization filter, or a color enhancing element, which may act to separate wavelength sensitivities of light-detecting elements designated for different colors such that the colors detected by the light-detecting elements suit human color perception.

It should be realized that a plurality of BEOL layers may be deposited in the method for producing the image sensor. Thus, one or more of such BEOL layers may be deposited together with planarizing metal dummy patterns. The planarizing metal dummy patterns formed in a plurality of BEOL layers may act together to provide the desired function as a passive optical element. However, it should be realized that in some embodiments, only a single planarizing metal dummy pattern is formed in a single BEOL layer, which single planarizing metal dummy pattern may then provide the desired effect on incident light.

According to an embodiment, the method further comprises depositing a second BEOL layer above the first BEOL layer, said second BEOL layer comprising metal wirings being arranged to form connections to components on the substrate; and together with depositing the second BEOL layer, improving planarization of the second BEOL layer by depositing a planarizing metal dummy pattern in the second BEOL layer, wherein a part of the planarizing metal dummy pattern is arranged above a light-detecting element, wherein the planarizing metal dummy pattern is formed from the same material as the metal wirings and is deposited to planarize density of the metal deposited in the second BEOL layer across a surface of the layer; wherein the planarizing dummy patterns in the first and the second BEOL layers forming a first dummy layer and a second dummy layer in a stack of dummy layers above the array of light-detecting elements in order to affect light transfer to the array of light-detecting elements.

Hence, the stack of dummy layers may act in concert in order to provide a desired optical effect.

According to an embodiment, a shape, position and/or refractive index of the first dummy layer is different from a shape, position and/or refractive index of the second dummy layer in order to affect light transfer to the light-detecting element.

The dummy layers need not have identical layout in order to provide sufficient planarization, or forming a sufficiently uniform, BEOL layer. This implies that the pattern of different dummy layers may differ in shape, position and/or refractive index so as to provide a desired optical effect.

The design of the one or more dummy layers may be based on prerequisites set by fundamental design of the image sensor. Thus, a choice of material in a BEOL layer may be made based on the desired connections to be formed with the substrate. Then, the design of dummy layers may have to make do with such choices (which may e.g. set a refractive index based on the material to be used). Given the prerequisites, a design of the dummy layer may thereafter be set in order to provide a planarizing effect of the BEOL layer(s) and set an optical effect of the dummy layer(s).

According to an embodiment, a second BEOL layer is deposited above the first BEOL layer without an intermediate planarizing step, such as by chemical-mechanical polishing (CMP).

Thus, the forming of first and second BEOL layers may be provided by the method without a need of planarizing the first BEOL layer so as to enable forming of subsequent layers thereon. This may substantially reduce number of steps needed for producing the image sensor and, hence, enable inexpensive production of the image sensor.

However, it should be realized that an intermediate planarizing step, such as CMP, may still be performed. Thanks to the planarizing metal dummy pattern, the planarizing step may act more uniformly on the BEOL layer. This may also reduce dishing effects occurring during CMP planarization.

According to a second aspect, there is provided an image sensor, comprising: an array of light-detecting elements arranged in a substrate; a back end of line (BEOL) layer arranged above the substrate, said BEOL layer comprising metal wirings for forming metal connections to components on the substrate; wherein, said BEOL layer further comprises a metal dummy pattern, wherein a part of the metal dummy pattern is arranged above a light-detecting element in the array and between metal wirings, such that the shape, position and/or refractive index of the parts of the metal dummy pattern affects the light transferred to the array of light-detecting elements.

Effects and features of this second aspect are largely analogous to those described above in connection with the first aspect. Embodiments mentioned in relation to the first aspect are largely compatible with the second aspect.

As explained above, the image sensor may be produced in an inexpensive manner. Further, the image sensor may provide an improved functionality based on the dummy pattern affecting the incident light so as provide a desired optical effect.

The dummy pattern may be distributed in the BEOL layer for defining the optical effect. At least one characteristic of shape, position and/or refractive index of the dummy pattern may contribute to the optical effect of the dummy pattern.

In particular, metal particles may be arranged in the dummy pattern so as together form a passive optical component providing a desired optical effect above the array of light-detecting elements. Thus, the arrangement of metal particles in particular positions, and possibly with particular shapes, forming a pattern may ensure that the desired optical effect is provided.

Additionally or alternatively, the refractive index of the metal material may operate to provide an optical effect in the dummy pattern.

According to an embodiment, the metal dummy pattern is formed by the same material as the metal wirings and forms a pattern to which no voltage is supplied.

Thus, the dummy pattern is formed by the material in the BEOL layer such that the dummy pattern and the BEOL layer may be deposited simultaneously.

As mentioned above, the dummy pattern may not contribute to logic implementation of the image sensor and may therefore not be connected to any lines for receiving/outputting electrical signals, i.e. no voltage is supplied to the dummy pattern.

According to an embodiment, the metal dummy pattern in the BEOL layer is configured to planarize a density of the metal in the BEOL layer across a surface of the layer.

Thanks to the dummy pattern being present in the BEOL layer and being arranged above the array of light-detecting elements, there is not a large surface above the light-detecting elements wherein no metal is present. This planarized the density of the metal in the BEOL layer, which simplifies producing of the image sensor.

According to an embodiment, the image sensor comprises a plurality of BEOL layers arranged above the substrate, each comprising metal dummy patterns arranged above a light-detecting element in the array, the metal dummy patterns of the plurality of layers forming a stack of dummy layers above the light-detecting element and are configured in order to affect the light transferred to the array of light-detecting elements.

Thus, a desired optical effect may be provided by a plurality of dummy patterns.

According to an embodiment, a shape, position and/or refractive index of a first dummy layer is different from a shape, position and/or refractive index of a second dummy layer in order to affect light transfer to the light-detecting element.

Thus, the first and second dummy layers may be differently designed in order to provide the desired optical effect.

According to an embodiment, a lens is formed based at least on the metal dummy pattern for improving collection of light on the light-detecting element.

Thanks to the dummy pattern forming a lens, light-detecting elements in the array may receive a higher light intensity so that a pixel performance is improved.

A lens, such as a Fresnel lens, may be formed in a single layer of dummy pattern. However, the lens may alternatively be formed by combination of a plurality of dummy patterns in a plurality of layers.

According to an embodiment, a color filter is formed based at least on the metal dummy pattern for filtering light of selective wavelength or enhancing color detection of the light-detecting element.

Thus, the dummy pattern may provide a filtering functionality to the array of light-detecting elements such that the dummy pattern may act in selecting which wavelengths should be received by the light-detecting elements or adjusting a wavelength interval to be received by the light-detecting elements for color enhancement.

According to an embodiment, a filter selective to angle of incident light is formed based at least on the metal dummy pattern for angle-dependent detection of light by the light-detecting element.

This implies that an angle of incidence of light detected by light-detecting elements may be controlled by the dummy pattern.

According to a third aspect, there is provided an image sensor product obtainable by a complementary-metal-oxide (CMOS) manufacturing process, said process comprising: depositing a first back-end-of-line (BEOL) layer above a substrate comprising an array of light-detecting elements, said BEOL layer comprising metal wirings being arranged to form connections to components on the substrate and together with depositing the first BEOL layer, improving planarization of the first BEOL layer by depositing a planarizing metal dummy pattern in the first BEOL layer, wherein a part of the planarizing metal dummy pattern is arranged above a light-detecting element, wherein the planarizing metal dummy pattern is formed from the same material as the metal wirings and is deposited to planarize density of the metal deposited in the first BEOL layer across a surface of the layer and wherein a shape and/or position of parts of the metal dummy pattern above the array of light-detecting elements is designed to provide a desired effect on incident light.

Effects and features of this third aspect are largely analogous to those described above in connection with the first and second aspects. Embodiments mentioned in relation to the first and second aspects are largely compatible with the third aspect.

Thus, the invention enables that an image sensor may be produced using a relatively simple CMOS manufacturing process, which may not need planarizing of BEOL layers.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
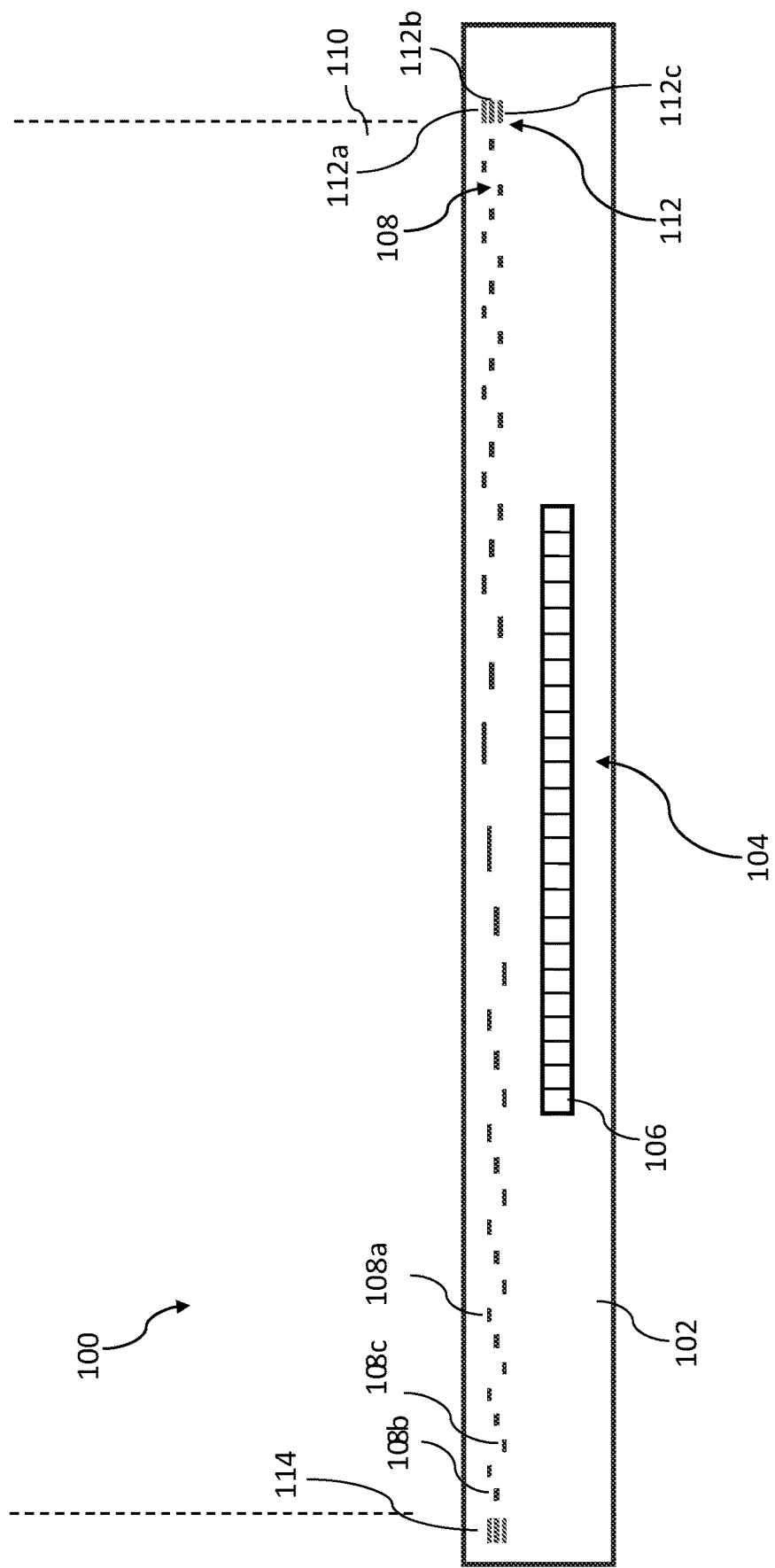
FIG. 1 is a schematic view of an image sensor according to an embodiment.

FIG. 1 is a schematic view of an image sensor 100. The image sensor 100 comprises a substrate 102 on which an array 104 of light-detecting elements 106 is formed. The image sensor 100 further comprises a metal pattern 108 arranged in one or more layers, here three layers are shown, above the array 104 of light-detecting elements 106 for providing an optical effect on incident light 110.

The light-detecting elements 106 may comprise a photosensitive area, e.g. in the form of a photo-diode for detecting a light intensity incident on the light-detecting elements 106. The light-detecting elements 106 may e.g. be formed in complementary metal-oxide-semiconductor (CMOS) technology for defining active pixel sensors, which may be used for reading out information of detected light intensities so as to form an image based on detected light intensities in the array 104 of light-detecting elements.

The image sensor 100 further comprises a back-end-of-line (BEOL) layer stack 112. The BEOL layer stack 112 is here shown to comprise three BEOL layers 112a-c, wherein each BEOL layer comprises a metal wiring 114 for forming a metal connection to the substrate 102 and hence providing an electrical connection to the substrate 102. The metal wirings 114 in the BEOL layers 112a-c are configured to connect to the substrate 102 at a position separate from an arrangement of the array 104 of light-detecting elements 106. This implies that the metal wirings 114 will not interfere with the incident light 110 reaching the light-detecting elements 106.

Metal patterns 108a-c are formed in each of the BEOL layers 112a-c. This implies that the metal patterns 108a-c may ensure that a relatively uniform distribution of metal is provided in the BEOL layers 112a-c. This may facilitate production of the image sensor 100 as the BEOL layers 112a-c may be deposited without requiring planarization in-between depositing of consecutive BEOL layers 112a-c.

The metal patterns 108a-c may in combination provide an optical effect on the incident light beam 110 so as to enhance performance of the image sensor 100.

The metal patterns 108a-c may provide a shape, position and/or refractive index of parts of the metal patterns 108a-c that in combination provides an optical effect. The metal patterns may form a passive optical component for providing the optical effect.

The optical component may be formed using a plurality of layers of metal patterns 108a-c, which in combination provide the optical effect. However, it should be realized that an optical effect may be provided using a single layer of metal pattern.

According to an embodiment, the metal patterns 108a-c may form a lens, such as a Fresnel lens. According to an alternative embodiment, the metal patterns 108a-c may form a filter, such as color filter, an angular filter or a polarization filter, or a color enhancing element.

Figure 2:
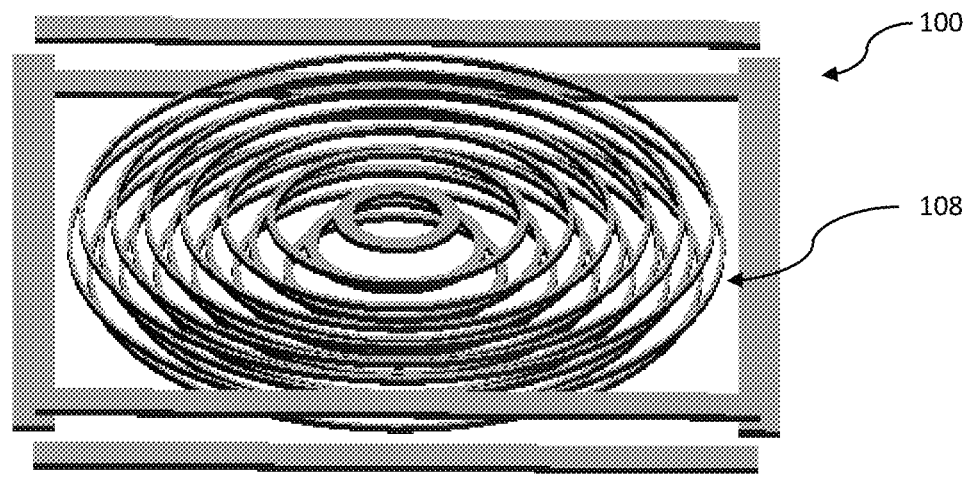
FIG. 2 is a schematic perspective view of a lens formed in BEOL layers above an array of light-detecting elements.

Referring now to FIG. 2, a perspective view of an optical sensor 100 is shown in order to illustrate the forming of a lens using metal patterns 108. The metal patterns are patterned to form concentric rings with a diameter of the rings varying between different BEOL layers. This configuration of the metal patterns 108 may be used for forming a Fresnel-type lens.

Figure 3A:
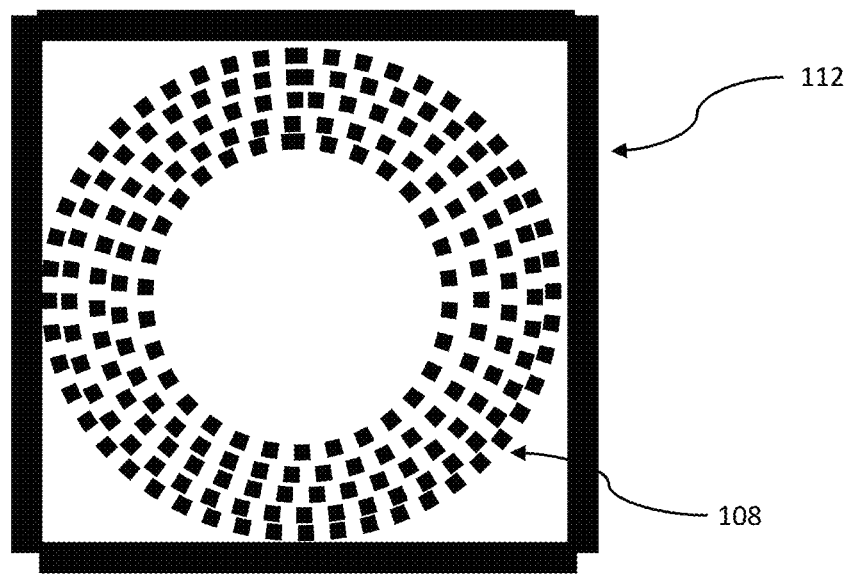
FIGS. 3a-c are schematic view of embodiments metal patterns in a single BEOL layer above an array of light-detecting elements.
Figure 3B:
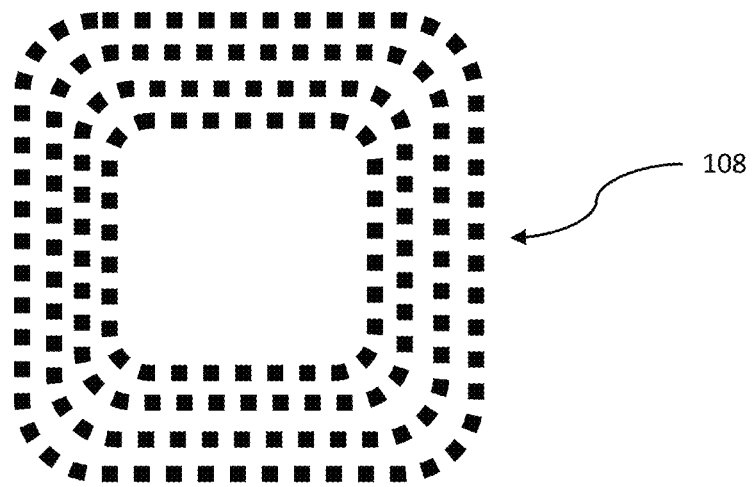
Figure 3C:
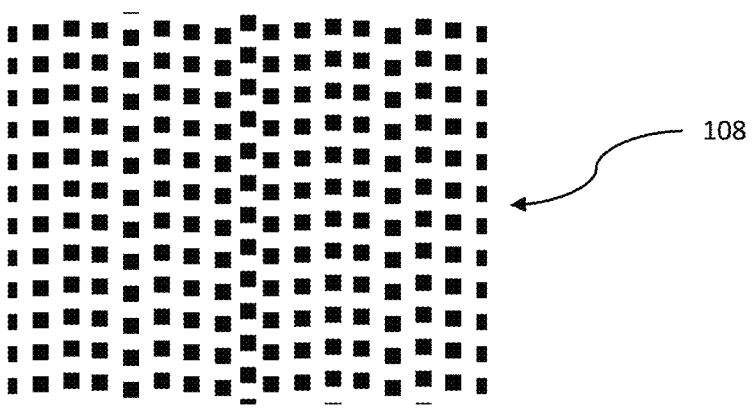

Referring now to FIGS. 3a-c, different configurations of a metal pattern 108 formed in a single BEOL layer 112 are shown, wherein the single layer metal pattern 108 is formed so as to provide a desired optical effect. The configurations of FIGS. 3a-c may provide passive optical elements for affecting an incident light beam 110 towards the array 104 of light-detecting elements 106.

The pattern illustrated in FIG. 3a is a relatively simple configuration for providing a lens and focusing the incident light beam 110 towards the array 104 of light-detecting elements 106 so as to improve light collection.

The pattern illustrated in FIG. 3b is a configuration for providing a lens that is adapted to a square size of light-detecting elements 106.

The pattern illustrated in FIG. 3c may provide a filtering effect on incident light.

Figure 4:
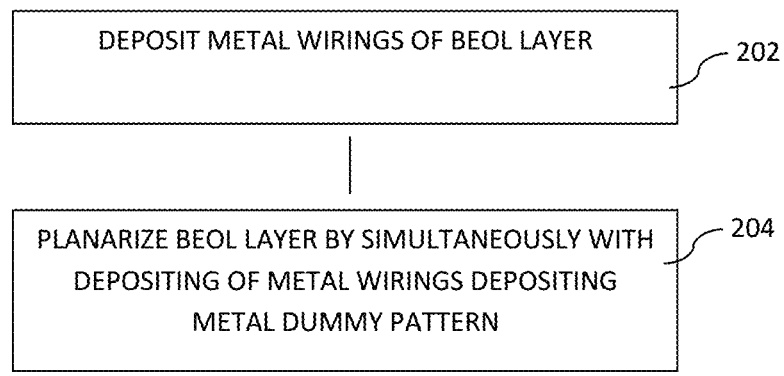
FIG. 4 is a flow chart of a method according to an embodiment.

Referring now to FIG. 4, a method of producing the image sensor 100 will be described. An array 104 of light-detecting elements 106 may be formed on a substrate 102 using conventional CMOS processing steps.

The method comprises depositing 202 a BEOL layer 112 above the substrate 102 in order to form electrical connections by metal wirings 114 to the substrate 102. In depositing of the BEOL layer 112, simultaneously with forming of the metal wirings 114, the BEOL layer 112 is planarized 204 by means of depositing of a metal dummy pattern 108 in the BEOL layer 112 so as to provide a relatively uniform distribution of metal in the BEOL layer 112. This enables producing of an image sensor 100 using relatively simple CMOS processing steps facilitating inexpensive production of the image sensor 100 while also allowing the image sensor 100 to be provided with a passive optical component in one or more BEOL layers 112 above the array 104 of light-detecting elements 106.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method for producing an image sensor, said method comprising:
    depositing a first back-end-of-line (BEOL) layer above a substrate comprising an array of light-detecting elements, said BEOL layer comprising metal wirings being arranged to form connections to components on the substrate,
    wherein the light-detecting elements, each comprising a photo-sensitive area, the photo-sensitive areas of the light-detecting elements being configured to detect light incident on the image sensor from above the first BEOL layer;
    together with depositing the first BEOL layer, improving planarization of the first BEOL layer by depositing a planarizing metal dummy pattern in the first BEOL layer,
    wherein a part of the planarizing metal dummy pattern is arranged directly above a photo-sensitive area of a light-detecting element of the array of light-detecting elements,
    wherein the incident light passes through a transparent part between the planarizing metal dummy pattern before reaching the array,
    wherein the planarizing metal dummy pattern is formed from a same material as the metal wirings and is deposited to planarize a density of a metal deposited in the first BEOL layer across a surface of the first BEOL layer, and
    wherein a shape, or a position, or a combination of both a shape and a position of a part of the planarizing metal dummy pattern directly above the array of light-detecting elements is designed to provide an optical effect on the incident light; and
    depositing a second BEOL layer above the first BEOL layer without a chemical-mechanical polishing (CMP) intermediate planarizing step.

2. The method according to claim 1, wherein said second BEOL layer comprises metal wirings being arranged to form connections to components on the substrate; and
    together with depositing the second BEOL layer, improving planarization of the second BEOL layer by depositing a planarizing metal dummy pattern in the second BEOL layer, wherein a part of the planarizing metal dummy pattern in the second BEOL layer is arranged above a light-detecting element, wherein the planarizing metal dummy pattern in the second BEOL layer is formed from the same material as the metal wirings in the second BEOL layer, and is deposited to planarize a density of a metal deposited in the second BEOL layer across a surface of the second BEOL layer,
    wherein the planarizing dummy patterns in the first and the second BEOL layers forming a first dummy layer and a second dummy layer in a stack of dummy layers above the array of light-detecting elements in order to affect light transfer to the array of light-detecting elements.

3. An image sensor, comprising:
    an array of light-detecting elements arranged in a substrate; and
    a back end of line (BEOL) layer arranged above the substrate, said BEOL layer comprising metal wirings for forming metal connections to components on the substrate, wherein the light-detecting elements, each comprising a photo-sensitive area, the photo-sensitive areas of the light-detecting elements being configured to detect light incident on the image sensor from above the BEOL layer, wherein said BEOL layer further comprises a metal dummy pattern, wherein the incident light passes through a transparent part between the metal dummy pattern before reaching the array, and wherein a part of the metal dummy pattern is arranged directly above a photo-sensitive area of a light-detecting element in the array of light-detecting elements, and between metal wirings, such that at least one of a shape, a position, or a refractive index of a part of the metal dummy pattern directly above the array of light-detecting elements affects the incident light transferred to the array of light-detecting elements.

4. The image sensor according to claim 3, wherein the metal dummy pattern is formed by a same material as the metal wirings and forms a pattern to which no voltage is supplied.

5. The image sensor according to claim 3, wherein the metal dummy pattern in the BEOL layer is configured to planarize a density of a metal in the BEOL layer across a surface of the BEOL layer.

6. The image sensor according to claim 3, wherein the image sensor comprises a plurality of BEOL layers arranged above the substrate, each comprising metal dummy patterns arranged above a light-detecting element in the array, the metal dummy patterns of the plurality of layers forming a stack of dummy layers above the light-detecting element and are configured in order to affect the light transferred to the array of light-detecting elements.

7. The image sensor according to claim 3, wherein the metal dummy pattern forms a lens for improving collection of light on the light-detecting element.

8. The image sensor according to claim 3, wherein the metal dummy pattern forms a color filter for filtering light of selective wavelength or enhancing color detection of the light-detecting element.

9. The image sensor according to claim 3, wherein the metal dummy pattern forms a filter selective to angle of incidence of light for angle-dependent detection of light by the light-detecting element.

10. An image sensor product obtainable by a complementary-metal-oxide (CMOS) manufacturing process, said process comprising:

depositing a first back-end-of-line (BEOL) layer above a substrate comprising an array of light-detecting elements, said BEOL layer comprising metal wirings being arranged to form connections to components on the substrate, wherein the light-detecting elements, each comprising a photo-sensitive area, the photo-sensitive areas of the light-detecting elements being configured to detect light incident on the image sensor from above the first BEOL layer;

together with depositing the first BEOL layer, improving planarization of the first BEOL layer by depositing a planarizing metal dummy pattern in the first BEOL layer, wherein a part of the planarizing metal dummy pattern is arranged directly above a photo-sensitive area of a light-detecting element of the array of light-detecting elements, wherein the incident light passes through a transparent part between the planarizing metal dummy pattern before reaching the array, wherein the planarizing metal dummy pattern is formed from a same material as the metal wirings and is deposited to planarize a density of a metal deposited in the first BEOL layer across a surface of the first BEOL layer and, wherein a shape, or a position, or a combination of both a shape and a position of a part of the metal dummy pattern directly above the array of light-detecting elements is designed to provide an optical effect on the incident light; and depositing a second BEOL layer above the first BEOL layer without a chemical-mechanical polishing (CMP) intermediate planarizing step.

\* \* \* \* \*